(12) United States Patent
Shoji

(10) Patent No.: US 7,781,855 B2
(45) Date of Patent: Aug. 24, 2010

(54) OPTICAL DEVICE

(75) Inventor: Iwao Shoji, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 196 days.

(21) Appl. No.: 12/148,372

(22) Filed: Apr. 18, 2008

(65) Prior Publication Data
US 2008/0290439 A1    Nov. 27, 2008

(30) Foreign Application Priority Data
Apr. 19, 2007  (JP)  ............... 2007-110253

(51) Int. Cl.
*H01L 31/0203* (2006.01)
(52) U.S. Cl. ............... 257/434; 257/432; 257/680
(58) Field of Classification Search ............ 257/432, 257/434, 680, 686, E31.117, E31.127
See application file for complete search history.

(56) References Cited

U.S. PATENT DOCUMENTS

| | | | |
|---|---|---|---|
| 5,059,791 A | * | 10/1991 | Ishizuka et al. ........ 250/231.17 |
| 7,553,164 B2 | * | 6/2009 | Usui et al. ............... 439/65 |
| 2002/0130536 A1 | * | 9/2002 | Kams ................ 297/184.13 |
| 2007/0114547 A1 | * | 5/2007 | Fujita et al. ............. 257/98 |
| 2008/0018878 A1 | * | 1/2008 | Mizuo et al. ............ 356/3.01 |
| 2008/0278241 A1 | * | 11/2008 | Harm ..................... 330/286 |
| 2008/0278954 A1 | * | 11/2008 | Speier ................... 362/373 |
| 2008/0297048 A1 | * | 12/2008 | Vermeulen ............. 313/512 |

FOREIGN PATENT DOCUMENTS

JP  2006-093359 A  4/2006

\* cited by examiner

*Primary Examiner*—Phuc T Dang
(74) *Attorney, Agent, or Firm*—Frishauf, Holtz, Goodman & Chick, P.C.

(57) ABSTRACT

An optical device includes a metal film that has a first plane and a second plane electrically connected to the first plane. For example, the second plane is integrally formed with the first plane. The second plane is arranged at an obtuse angle θ (90°<θ<180°) with respect to the first plane. An optical semiconductor chip is mounted on the second plane of the metal film, and a light-transmitting sealing material seals the optical semiconductor chip. The light-transmitting sealing material has the metal film provided on a surface thereof.

20 Claims, 9 Drawing Sheets

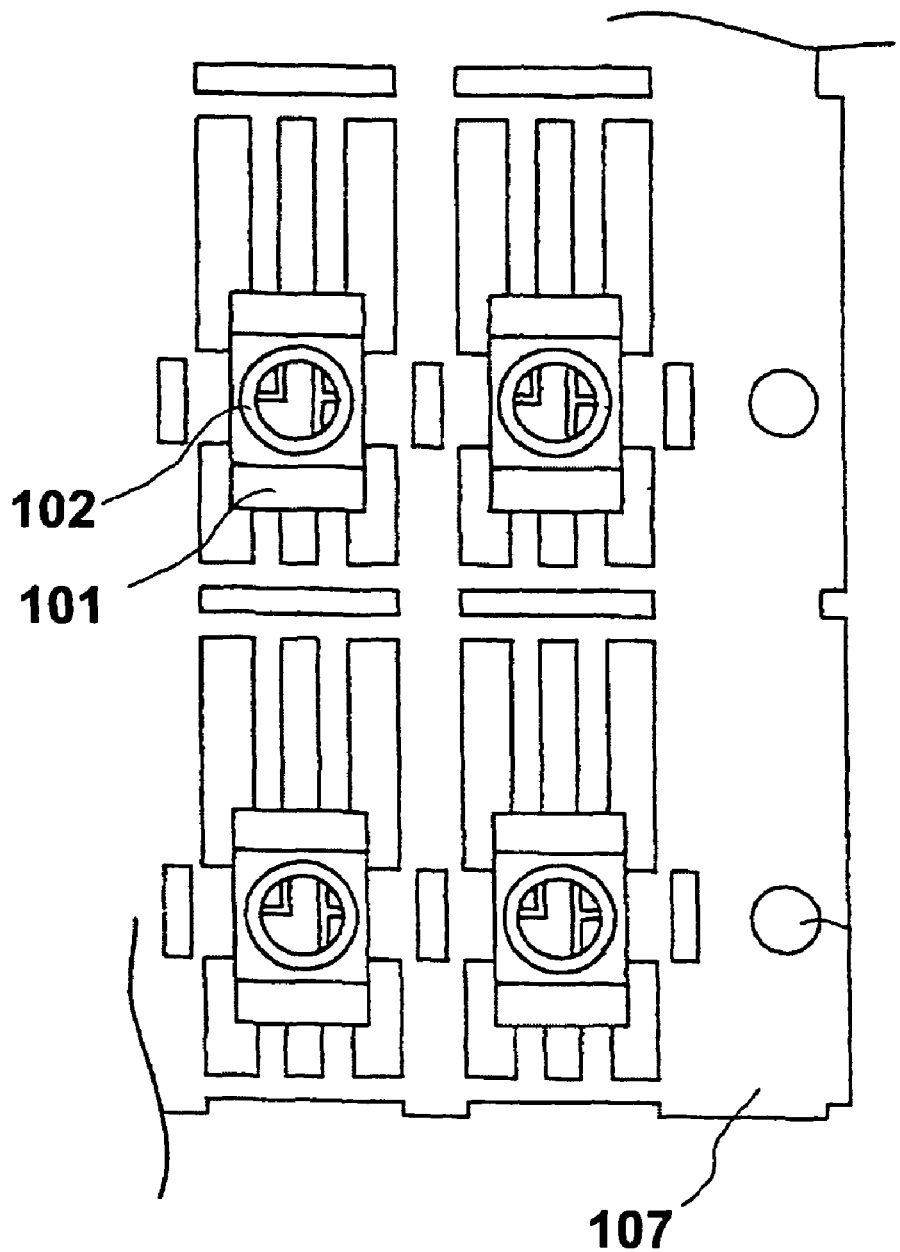

Fig. 9
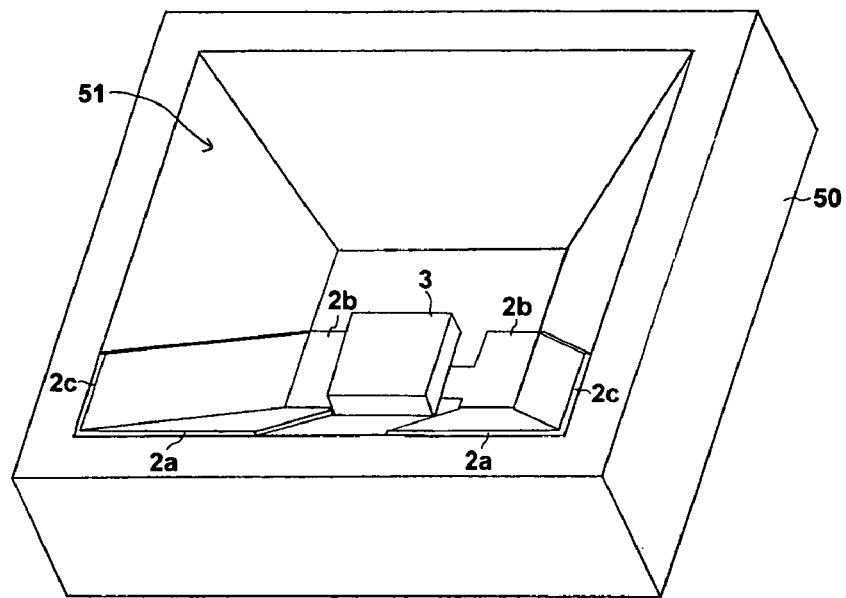
Fig. 10
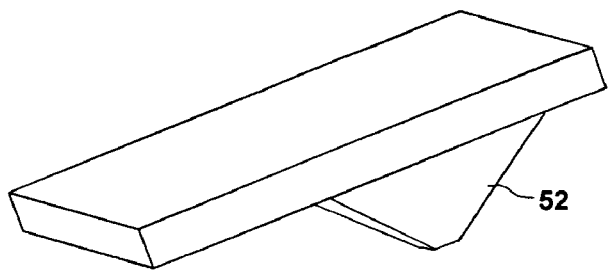
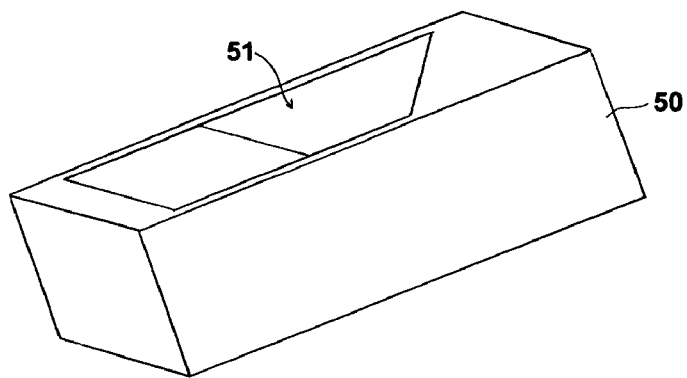

OPTICAL DEVICE

CROSS-REFERENCE TO RELATED APPLICATIONS

This application claims the priority benefit under 35 U.S.C. §119 of Japanese Patent Application No. 2007-110253 filed on Apr. 19, 2007, which is hereby incorporated by reference in its entirety.

BACKGROUND OF THE INVENTION

1. Field of the Invention

The present invention relates to an optical device.

2. Description of the Related Art

Japanese Patent Application Laid-Open No. 2006-93359, which is hereby incorporated by reference, describes a conventional light emitting device in which LEDs are arranged in a diagonal direction (hereinafter, referred to as a diagonal LED). FIG. 1 is a schematic diagram of the light emitting device described in Japanese Patent Application Laid-Open No. 2006-93359. The light emitting device 100 of FIG. 1 has a plastic leaded chip carrier (PLCC) structure. With this structure, LED chips (e.g., blue and red LED chips 105 and 106) are attached by die bonding into a recess 102 of a package 101, which is molded with a lead frame 104 as an insert. The lead frame and the LED chips are electrically connected to each other by wire bonding with Au wires (not shown). A sealing resin 103 is then injected into the recess 102, thereby protecting the LED chips 105, 106 and the Au wires as well as bonding the lead frame 104 and the molding resin of the package 101 to each other.

Since the fabrication of the PLCC structure such as the structure shown in FIG. 1 includes insert-molding a lead flame such as the lead frame (matrix frame) 107 shown in FIG. 2 and die-bonding LED chips onto the lead frame, which has a flat shape, a step of cutting and forming the lead frame into shape is required.

The sealing resin also needs to be injected into the recess of the insert-molded package, and as a result the molding resin of the package and the sealing resin can sometimes peel off from each other.

Moreover, dicing the matrix frame 107 into individual pieces produces cutting burrs, which may result in a lifted mount. In addition to this, forming the lead frame 104 (bending the lead frame at several points into a triangular shape) can cause springback, whereby the LED may be mounted in an abnormal position.

The configuration shown in FIG. 1 entails resin molding, and it is therefore necessary to reduce the thickness of the resin if miniaturization is intended. In a reflow soldering step, however, the housing (package 101) is subjected to temperatures as high as 260° C. or more. Resins that are resistant to these high temperatures even with a low profile are limited to such special resins as LCP (liquid crystal polymer) and PEEK (polyetheretherketone), which require different conditions than in typical resin molding, including molding temperature and pressure. PPA (polyphthalamide), nylon 9T, and other resins that have high reflectance in the visible light region in particular tend to exceed their allowable temperatures for thermal deformation, and thus are difficult to use. Fillers can surely be added into the resins for the purpose of increasing the allowable temperature limits. However, adding fillers lowers the reflectances of the resins, and makes their molding conditions including temperature, injection speed, and injection pressure more difficult to adjust than those of ordinary resins. Furthermore, due to the drop in flowability of resins resulting from adding fillers, there has been a problem that the resins are not usable for diagonal LEDs of small size, which require molding of small thicknesses.

Furthermore, if the device is miniaturized, and the LEDs are enhanced in output and reduced in wavelength, then the resin material of the housing (the package 101) undergoes even higher irradiation and higher photon energy, causing a drop in reflectance due to photo-degradation. The resulting specular change makes a drop in output greater than with light emitting diodes of longer wavelengths, thereby contributing to variations between the outputs of different wavelengths within the same package.

For the sealing resin 103, a silicone resin or a modified silicone-epoxy resin resistant to short wavelengths is used. Despite being resistant, the sealing resin peels off due to housing degradation, and forms a channel for moisture absorption, through which Ag plating on the lead frame can be oxidized and sulfurized. This oxidation and sulfurization leads to a drop in reflectance with a decrease in light intensity. The oxidation and sulfurization also reduces the adhesion between the lamp house (package 101) and the lead frame 104, causing problems in moisture resistance and reflow resistance.

As described above, the diagonal LED of PLCC type shown in FIG. 1 cannot solve the problem of springback due to the cutting and forming of the lead frame, or the problem of the miniaturization limit of the molding resin.

SUMMARY OF THE INVENTION

An object of the present invention is to provide an optical device which is capable of miniaturization, and in which an optical semiconductor chip (light emitting element and/or light receiving element) can be arranged in a diagonal direction with high stability and reliability without causing springback or the like.

According to one aspect of the present invention, an optical device includes: a metal film having a first plane and a second plane electrically connected to the first plane, wherein the second plane is arranged at an obtuse angle $\theta$ ($90° < \theta < 180°$) with respect to the first plane. An optical semiconductor chip is mounted on the second plane of the metal film, and a light-transmitting sealing material seals the optical semiconductor chip. The light-transmitting sealing material has the metal film provided on a surface thereof.

With this structure, it is possible to arrange the optical semiconductor chip in a diagonal direction with high stability and reliability without causing springback or the like, and to minimize the entire optical device as well.

Additionally, the metal film may have side portions on both sides of the first plane and the second plane, wherein the side portions are electrically connected to the first plane and the second plane.

Moreover, each of the side portions may have a notch. With this structure, when forming solder fillets on the side portions, internal bubbles occurring from the solder can thus be released through the notched side portions. This can suppress the development of solder balls, and increase the joint area with the resin for enhanced adhesion.

Still further, the sealing material may have a lens shape for functioning as a lens with respect to the optical semiconductor chip. This configuration eliminates the need to provide an additional lens member.

The optical semiconductor chip may be a light emitting element, and the optical device can function as a projector. In this case, the sealing material may contain a wavelength converting material.

With this structure, the wavelength converting material (for example, a phosphor) can be excited by light from the light emitting element, so that colors of the light from the light emitting element and the excited light from the wavelength converting material are mixed with each other, thereby emitting light of a desired color, such as white light.

Yet still further, the optical semiconductor chip may be a light receiving element, and the optical device can function as a photoreceptor.

BRIEF DESCRIPTION OF THE DRAWINGS

These and other characteristics, features, and advantages of the present invention will become clear from the following description with reference to the accompanying drawings, wherein:

FIG. 2 is a diagram for explaining the manufacturing of the light emitting device of FIG. 1;

FIG. 9 is a schematic perspective view for explaining steps for manufacturing the optical device;

FIG. 10 is a schematic perspective view for explaining steps for manufacturing the optical device;

DETAILED DESCRIPTION

Hereinafter, preferred exemplary embodiments made in accordance with the principles of the present invention will be described with reference to the drawings.

Figure 3A:
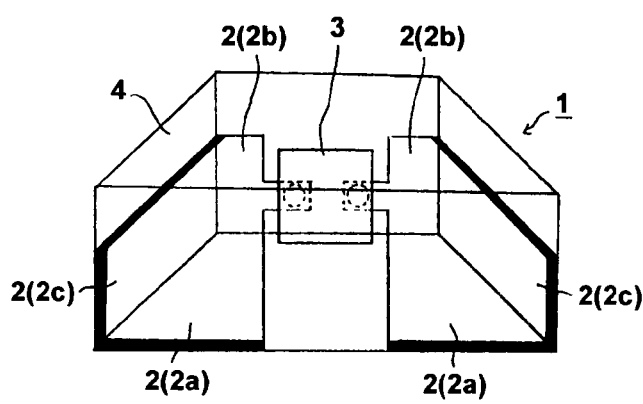
FIGS. 3A and 3B are front and side views, respectively, showing an example of the configuration of an optical device according to one aspect of the present invention.
Figure 3B:
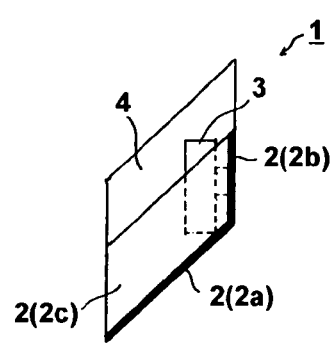

FIGS. 3A and 3B are front and side views, respectively, showing an example of the configuration of an optical device 1 according to one aspect of the present invention. With reference to FIGS. 3A and 3B, the optical device 1 includes a metal film 2, an optical semiconductor chip 3, and a light-transmitting sealing material 4. The metal film 2 has a first plane 2a, and a second plane 2b which forms an obtuse angle $\theta$ ($90°<\theta<180°$) with respect to the first plane 2a (see FIG. 4) and is electrically connected to the first plane 2a (for example, the second plane 2b is formed integrally with the first plane 2a). The optical semiconductor chip 3 is mounted on the second plane 2b of the metal film 2. The sealing material 4 seals the optical semiconductor chip 3, and has the metal film 2 provided on a surface thereof.

In the optical device 1 shown in FIGS. 3A and 3B, the metal film 2 can also have side portions 2c on both sides of the first plane 2a and the second plane 2b. The side portions 2c are electrically connected to the first plane 2a and the second plane 2b. These side portions 2c can be provided for purposes such as forming solder fillets on the side portions 2c.

In the optical device 1 of FIGS. 3A and 3B, the optical semiconductor chip 3 may be a light emitting element (such as a light emitting diode (LED) chip) and/or a light receiving element (such as a photodetector (PD) chip). If the optical semiconductor chip 3 is a light emitting element (such as an LED chip), the optical device 1 can function as a light emitting device (projector). On the other hand, if the optical semiconductor chip 3 is a light receiving element (such as a PD chip), the optical device 1 can function as a light receiving device (photoreceptor).

Figure 4:
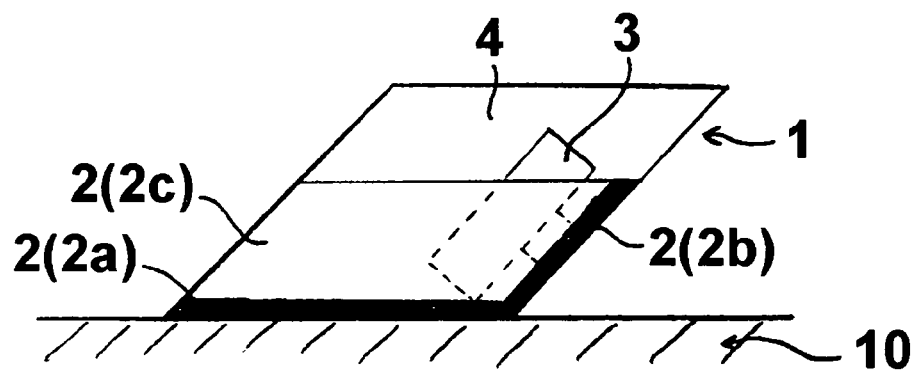
FIG. 4 is a diagram showing the optical device of FIGS. 3A and 3B when mounted on a mounting board.

In the optical device 1 of FIGS. 3A and 3B, the optical semiconductor chip 3 can be mounted, for example, on the second plane 2b of the metal film 2, which forms an obtuse angle $\theta$ ($90°<\theta<180°$) with respect to the first plane 2a, as shown in FIG. 4. When the first plane 2a of the metal film 2 is placed on a mounting board 10 for mounting, the optical semiconductor chip 3 lies in a diagonal direction with respect to the mounting board 10. With this structure, therefore, it is possible to provide an optical device 1 that has the optical semiconductor chip 3 (e.g., light emitting diode (LED) or photoreceptor (PD)) arranged in a diagonal direction.

Figure 1:
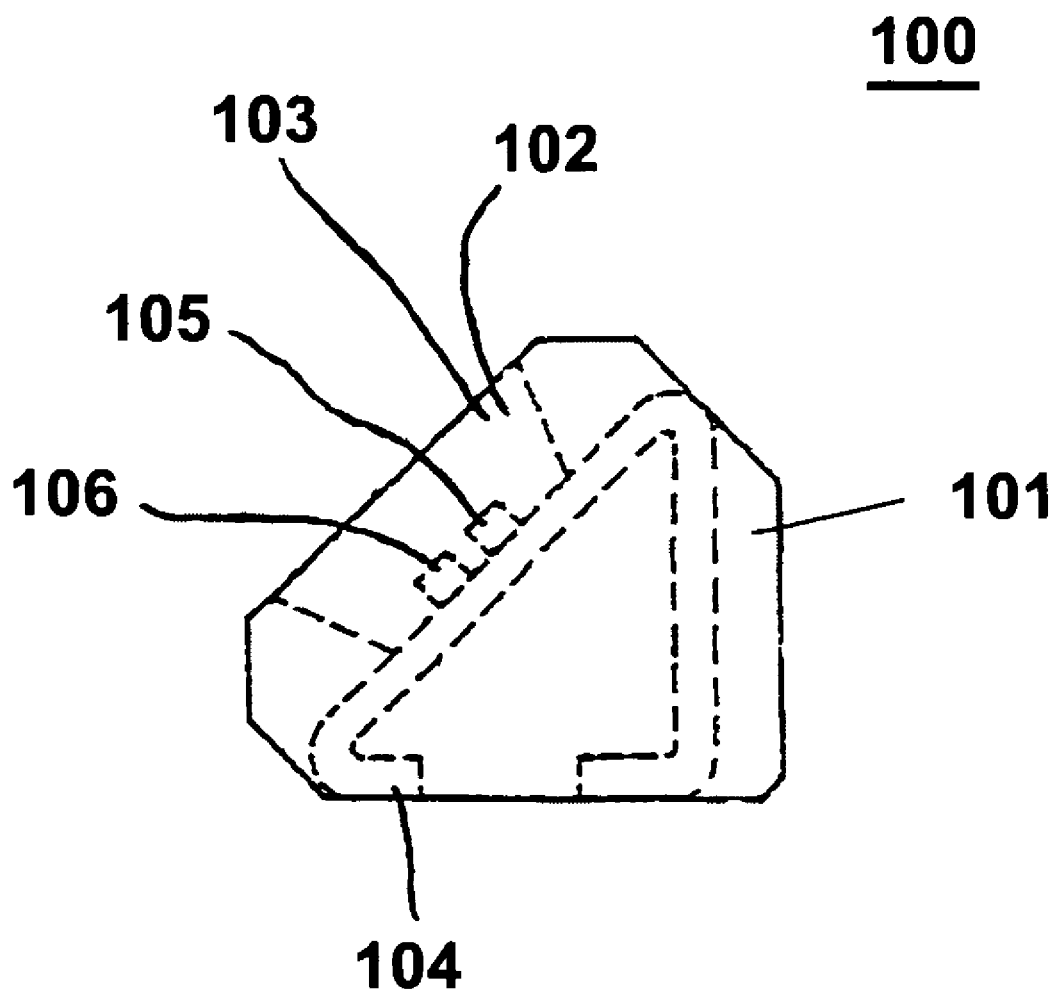
FIG. 1 is a schematic diagram of a conventional light emitting device.

When compared to the conventional configuration shown in FIG. 1, the optical device 1 uses no lead frame, but rather uses the metal film 2 which has at least the first plane 2a and the second plane 2b. As will be described, the metal film 2 can be deposited on a predetermined mold by vapor deposition or sputtering. The optical semiconductor chip 3 can thus be set on the metal film 2 with high stability and reliability without causing springback or the like. In addition, the light-transmitting sealing material (sealing resin) 4 can seal the optical semiconductor chip 3, and the metal film 2 is provided on the surface of the sealing material 4. This configuration makes it possible to reduce the size and profile of the optical device as compared to conventional structures (such as the PLCC structure).

Figure 5:
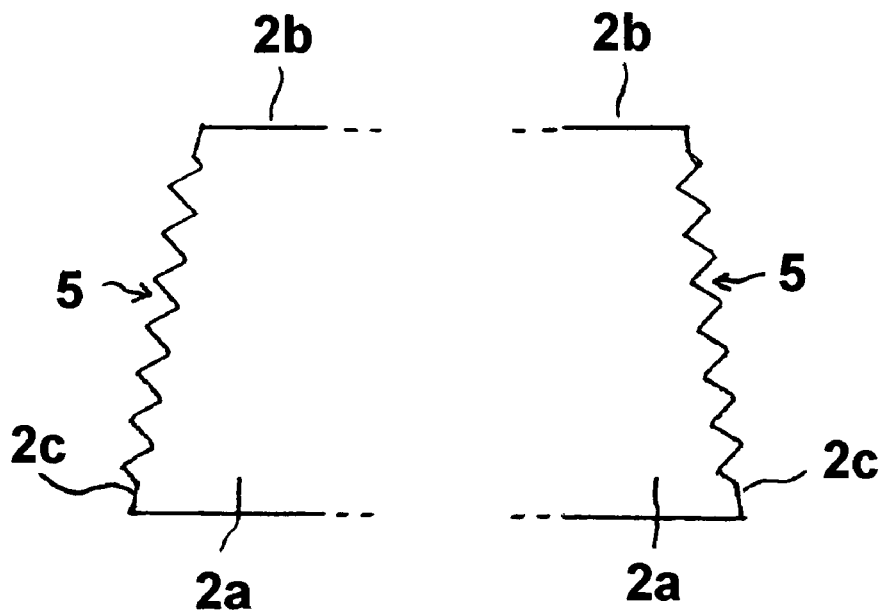
FIG. 5 is a schematic top view of a modification of the optical device of FIGS. 3A and 3B in which notches are formed in side portions of a metal film.

In the optical device of FIGS. 3A and 3B, notches 5 may be formed in the side portions 2c as shown in FIG. 5 (which is a schematic top view of this structure). If the notches 5 are formed in the side portions 2c as shown in FIG. 5, internal bubbles occurring from solder can be released through the side portions 2c having the notches 5 when forming solder fillets on these side portions 2c. This can suppress the development of solder balls, and increase the joint area with the resin (sealing material 4) for enhanced adhesion.

Figure 6:
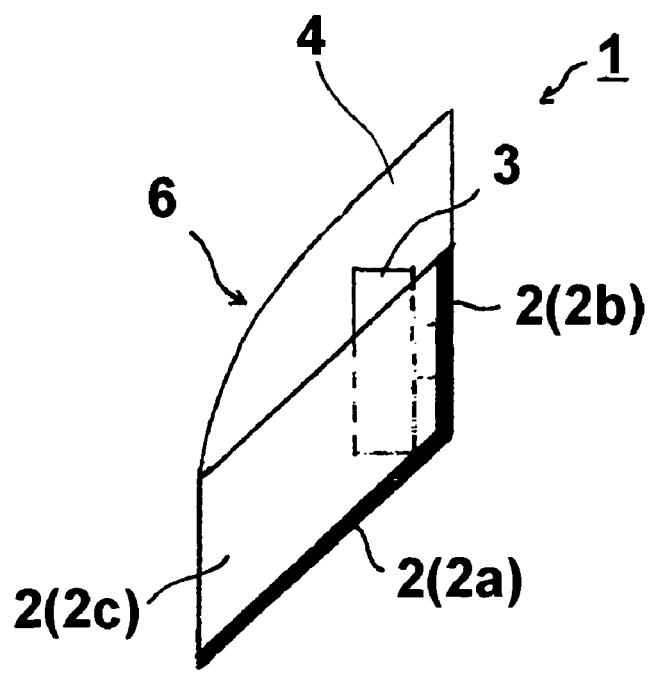
FIG. 6 is a diagram showing a further modification of the optical device of FIGS. 3A and 3B a sealing material is formed in a lens shape.

Moreover, in the optical device of FIGS. 3A and 3B, the sealing material 4 may have a lens shape 6 for functioning as a lens with respect to the optical semiconductor chip 3 as shown in FIG. 6. If the sealing material 4 has the lens shape 6 for functioning as a lens with respect to the optical semiconductor chip 3, it is unnecessary to provide an additional lens member.

In the optical device 1, the optical semiconductor chip 3 (light emitting element or light receiving element) is preferably mounted on the second plane 2b of the metal film 2 by flip-chip mounting (die bonding). If this optical semiconductor chip 3 is a light receiving element (PD chip, for example), the PD chip is of a back-illuminated type whereby light is incident on the back side of the PD chip.

The steps for manufacturing an optical device made in accordance with the principles of the present invention, such the optical device as shown in FIGS. 3A and 3B, will now be described.

Initially, a thermal oxide film is formed on the (100) plane of an Si wafer. Next, a resist is formed thereon by spin coating, followed by prebaking, mask exposure, and development so that the wafer is covered with the resist, excluding areas to be etched. After post-baking, the oxide film is etched with buffered hydrofluoric acid (BHF), which is a mixture of hydrofluoric acid (HF) and ammonium fluoride ($NH_4F$), using the resist as a mask. The resist is then removed. The etched article is then cleaned with RCA1 ($1pNH_3$ (25%)+$5pH_2O+1pH_2O_2$), is cleaned with RCA2 ($1pHCl+6pH_2O+1pH_2O_2$), and is immersed into HF.

Figure 7:
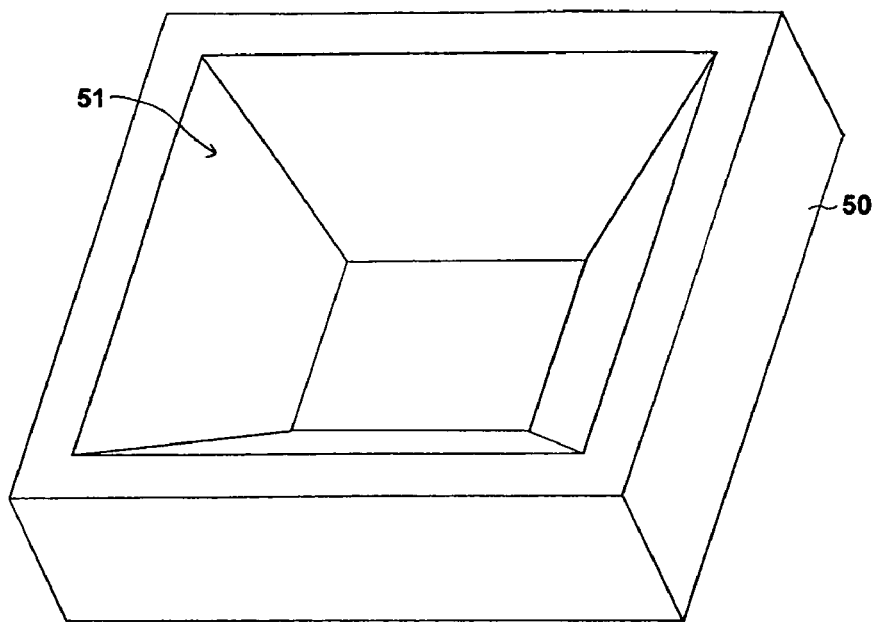
FIG. 7 is a schematic perspective view for explaining steps for manufacturing the optical device.

Using the remaining oxide film as a mask, KOH-based alkali wet etching is performed to make an Si base 50 which has a recess 51 such as shown in FIG. 7, with the (111) planes as slopes.

Figure 8:
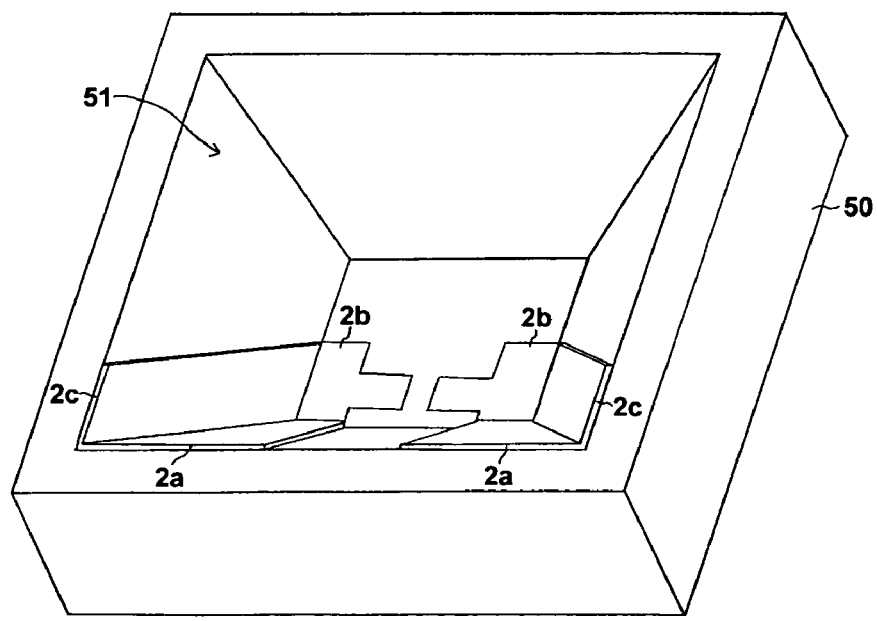
FIG. 8 is a schematic perspective view for explaining steps for manufacturing the optical device.

The oxide film is further etched with buffered hydrofluoric acid (BHF), which is a mixture of hydrofluoric acid (HF) and ammonium fluoride ($NH_4F$). A resist is applied to the surfaces, followed by prebaking, mask exposure, and development so that the Si base 50 is covered with the resist, excluding areas where a metal film (electrodes) is to be formed. Subsequently, a metal film (electrodes) of Au/Ni/Ag is deposited by vapor deposition or sputtering. The resist is lifted off with a remover solution, whereby the metal film (electrodes) 2 is patterned on predetermined positions of the Si base 50. FIG. 8 shows the state where the pattern of the metal film (electrodes) 2 is deposited in the recess 51 of the Si base 50 shown in FIG. 7.

Next, as shown in FIG. 9, the optical semiconductor chip 3 (light emitting element or light receiving element) is mounted (die bonded) onto the pattern of the metal film 2 shown in FIG. 8 (specifically, onto the second plane 2b of the metal film 2) with Au (gold) bumps.

Figure 11:
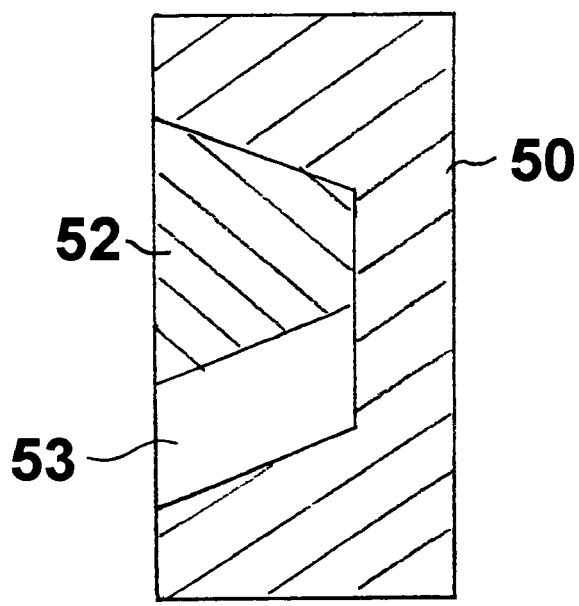
FIG. 11 is a schematic sectional view for explaining steps for manufacturing the optical device.

As shown in FIG. 10, after mounting of the optical semiconductor chip 3, a die piece 52 for defining the overall shape of the optical device is then inserted along the recess slopes into the recess 51 of the Si base 50. FIG. 11 is a schematic cross sectional view illustrating the die piece 52 inserted into the recess 51 of the Si base 50. When the die piece 52 is inserted, a cavity 53 for defining the overall shape of the optical device is formed between the Si base 50 and the die piece 52.

Figure 12:
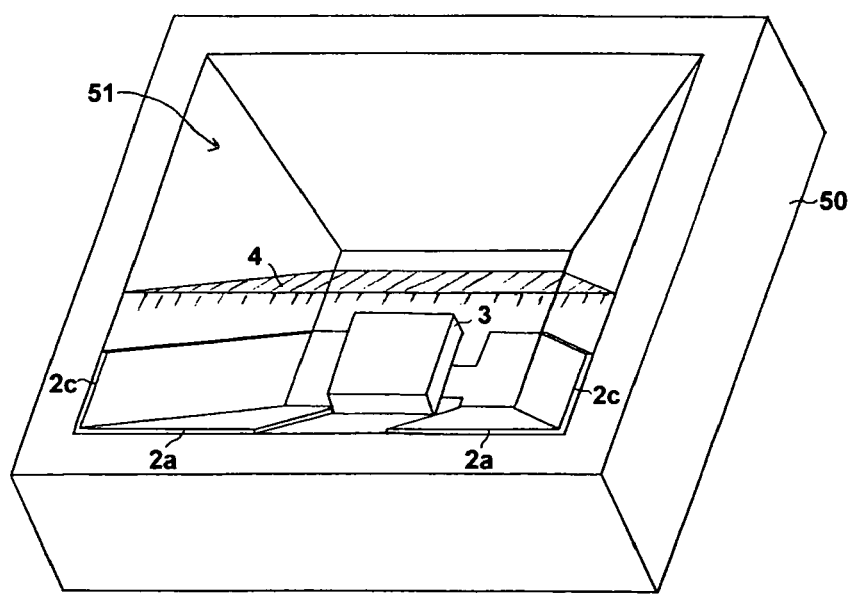
FIG. 12 is a schematic perspective view for explaining steps for manufacturing the optical device.

The sealing material (sealing resin) 4 is injected for sealing into the cavity 53. FIG. 12 shows the state where the die piece 52 is released after the cavity 53 formed by the die piece 52 is sealed with the sealing material 4.

Subsequently, the Si base 50 is removed by KOH-based alkali wet etching, which completes the optical device shown in FIGS. 3A and 3B.

Incidentally, the sealing material (sealing resin) 4 may be a silicone resin, epoxy resin, PVA resin, fluorine-based resin, or the like.

Now, in the case of manufacturing an optical device such as the one shown in FIG. 5, selective etching is applied to areas where the side portions are to be formed, thereby forming steps (not shown) in the Si base 50 when making the recess 51. The metal film 2 is then deposited on the surface of the Si base 50 which has the steps in the areas of the side portions. The optical semiconductor chip 3 is mounted on the second plane 2b of the metal film 2, followed by molding with the sealing material (sealing resin) 4. The Si base 50 is then removed by etching, to make the optical device that has notches 5 in the side portions 2c of the metal film 2 as shown in FIG. 5.

In the foregoing example of the manufacturing processes, the metal film 2 is made of Au/Ni/Ag. Nevertheless, the metal film 2 may be made of other combinations such as shown in Table 1.

TABLE 1

| 1 | 2 | 3 | 4 | 5 |
|---|---|---|---|---|
| AgBi | Ni | Ti | Ni | AgBi |
| AgBiNd | Pt | Cr | Pt | AgBiNd |
| AgNdCu | | Cu | Ni/Pd | AgNdCu |
| AgBiAu | | | W | AgBiAu |
| AgAuSn | | | | AgAuSn |
| AgAuSnCu | | | | AgAuSnCu |
| Ag | | | | Ag |
| Au | | | | Au |
| Cu | | | | |
| AgPd | | | | |

In Table 1, column (1) shows available materials which can be used for the side of the metal film 2 that is closer to the Si base 50, and column (5) shows available materials which can be used for the side of the metal film 2 for the optical semiconductor chip 3 to be mounted on. Columns (2) to (4) show metal layers to be included if necessary.

Alternatively, the metal film 2 may be patterned on desired positions by: depositing Cu by electroless plating on the Si base 50 having the recess 51 shown in FIG. 7; depositing Au by electrolytic plating; etching Cu in the electroless-plated areas; depositing a thick film of Cu by electroforming; covering the resultant structure with a resist excluding areas where electrodes are to be formed; and performing etching with ferric chloride. Au, AgBi, Pd, AgPd, Ag/Re, Ag/Rh, or other layers may further be deposited on this Cu film by electrolytic plating, so as to pattern a bonding-capable metal film 2.

Examples of the Cu etching solution which may be used include: ferric chloride; solutions consisting mainly of ammonium persulfide; ammonia complexes of ammonium persulfide; solutions consisting mainly of sulfuric acid and hydrogen peroxide; ammonia complexes of sulfuric acid and hydrogen peroxide; and solutions consisting mainly of chlorates.

In the foregoing example, the Si base 50 is etched with KOH. Aside from KOH, the Si base 50 may be etched by using tetramethylammonium hydroxide (TMAH), ethylene diamine pyrochatechol (EDP), or $N_2H_4+H_2O$. A dry etching process such as $XeF_2$ or $SF_6+C_4H_8$ Bosch process, a dicing process with oblique dicing blades, and a blasting process may also be used. Depending on the etching technique, the slope angles may be changed by changing the plane directions.

Practical examples of the optical device 1 will now be described.

A first practical example of the optical device 1 is a diagonal projector (LED projector). In this first practical example, the configuration shown in FIGS. 3A and 3B is such that the metal film 2 is made of a Ni-plated copper base, followed by Au plating. The LED chip 3 is bonded (die bonded) to the second plane 2b of the metal film 2 with gold bumps, and the resultant structure is protected by the sealing resin 4. As shown in FIG. 4, the first plane 2a of the metal film 2 is matched with the mounting board 10, whereby an LED projector for projecting light in a diagonal direction is provided.

Figure 13:
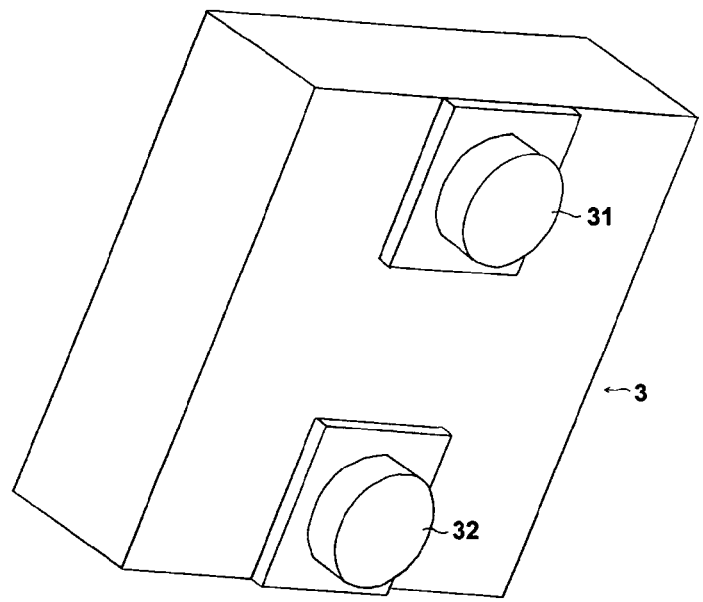
FIG. 13 is a schematic perspective view showing an example of the configuration of an LED chip.

FIG. 13 is a schematic perspective view showing an example of the configuration of the LED chip 3 to be die bonded to the second plane 2b of the metal film 2 as described above. In the example of FIG. 13, the LED chip 3 is configured as a flip-chip type LED, on one side of which a first bump 31 for functioning as a positive electrode and a second bump 32 for functioning as a negative electrode are formed. In this instance, the LED chip 3 can be die bonded to the metal film 2 (predetermined electrode patterns of the metal film 2) by bonding the first bump 31 to a positive electrode pattern of the metal film 2 and the second bump 32 to a negative electrode pattern of the metal film 2.

The LED core of the LED chip 3 in use may be made of group III nitride-based semiconductor compounds (such as a GaN light emitting layer). Aside from the group III nitride-based semiconductor compounds, LED chips made of ZnO-based oxide semiconductors, AlGaInP-based semiconductor compounds, and AlGaAs-based semiconductor compounds may be used as long as they are of the flip chip type.

A plurality of these LEDs may be used to provide multiple colors.

The diagonal projector according to the first practical example of the optical device 1 can irradiate an intended object diagonally when it is mounted on the mounting board 10 like other surface-mount devices. It will not cause the problem of springback as with PLCC type devices, and allows achievement of miniaturization and a low profile, which are difficult for PLCC type devices to achieve. Besides, the absence of housing deterioration precludes the formation of moisture-absorbing channels ascribable to exfoliation, thereby suppressing a drop in output.

A second practical example of the optical device 1 is a modification of the first practical example such that the sealing resin contains a predetermined wavelength converting material such as a phosphor. More specifically, the second practical example of the of the optical device 1 deals with the specific case where the LED chip described in the first practical example is a flip-chip LED chip that has a nitride-based semiconductor layer, or active layer, for emitting light of 480 nm or less in wavelength. For example, an LED chip for emitting colored light of, e.g., 463 nm in peak wavelength is used. A silicate phosphor that can emit fluorescence (with a peak wavelength of 563 nm) when excited by the light of the foregoing wavelength (e.g., 463 nm) from the LED chip may be mixed and used with the sealing resin 4 so that colors of the light from the LED chip and the excited light are mixed. This makes it possible to provide a diagonal projector capable of emitting light with a white color or incandescent-bulb color.

The foregoing second practical example uses a silicate phosphor as the wavelength converting material to be contained in the sealing material (sealing resin) 4. Nevertheless, a yellow phosphor, a green phosphor, a red phosphor, and so on, may also be used.

Examples of the yellow phosphor include: phosphors that are expressed by a general formula $R_3M_5O_{12}$:Ce, Pr, where R is at least one of yttrium (Y) and gadolinium (Gd), and M is at least one of aluminum (Al) and gallium (Ga); phosphors that contain oxynitride glass as a matrix; and thiogallate $CaGa_2S_4$:Eu.

Examples of the green phosphor include: phosphors expressed by a general formula $Y_3M_5O_{12}$:Ce, where M is at least one of aluminum (Al) and gallium (Ga); thiogallate $SrGa_2S_4$:Eu; silicate phosphor $Ca_3Sr(SiO_4)_3$:Ce; oxide phosphor $CaSr_2O_4$:Ce; and oxynitride phosphor $SrSi_2O_2N_2$:Eu.

Examples of the red phosphor include: sulfide-based phosphors expressed by a general formula $M_5S$:Eu, wherein in particular M is a nitride-based phosphor, such as $CaSiN_2$:Eu or $CaAlSiN_2$:Eu.

When using ultraviolet rays to provide fluorescence intended for white or other color mixing, available phosphors include mixtures of: blue-light emitting phosphors including aluminate phosphors $BaMg_2Al_{16}O_{27}$:Eu and $BaMgAl_{10}O_{17}$:Eu, and halophosphate phosphor $(Sr,Ca,Ba)_5(PO_4)_3Cl$:Eu; green-light emitting phosphors including aluminate phosphors $BaMg_2Al_{16}O_{27}$:Eu,Mn, halosilicate phosphor $Ca_8Mg(SiO_4)_4Cl$:Eu,Mn, silicate phosphor $((Ba,Sr,Ca,Mg)_{1-x}Eu_x)_2SiO_4$, and $Zn_2GeO_4$:Mn; and red-light emitting phosphors including oxysulfide phosphor $Y_2O_2S$:Eu, $Y_2O_3$:Eu,Bi, and thiogallate $(Sr,Ca,Ba)(Al,Ga)_2S_4$:Eu.

Among other red-light emitting phosphors available are ones that have a composition A $(Eu_{1-x-y}M_xSm_y)(W_{1-z}Mo_z)_2O_8$ in positions capable of absorbing light from the LED light source (where: A is at least one element selected from the group consisting of Li, Na, K, Rb, and Cs; M is at least one element selected from the group consisting of B, Al, Sc, Ga, In, Tl, Sb, Bi, Y, La, Gd, Lu, Nb, Ta, Hf, and P; x ranges within $0 \leq x \leq 0.3$; y ranges within $0 < y \leq 0.1$; and z ranges within $0 \leq z \leq 1$). Other phosphors available include red-light emitting phosphors expressed by $AEu_xLn_{1-x}M_2O_8$, which emit light when excited by blue to long-ultraviolet LED light sources, having a two- or one-dimensional array of $Eu^{3+}$ ions (where: $0 < x \leq 1$; A is at least one element selected from the group consisting of Li, Na, K, Rb, and Cs; Ln is at least one element selected from the group consisting of Y, La, Gd, and Lu; and M is at least one element selected from the group consisting of W and Mo).

Moreover, phosphors available for compensating for a lack of yellow light in a continuous RGB spectrum include: alkaline earth metal orthosilicate activated with bivalent europium, expressed by $(2-x-y)SrO.x(Ba, Ca)O.(1-a-b-c-d)SiO_2.aP_2O_2\ bAl_2O_3\ cBsO_3\ dGeO_2$:y $Eu^{2+}$ (where: $0 < x < 1.6$; $0.005 < y < 0.5$; and $0 < a, b, c, d < 0.5$); alkaline earth metal orthosilicate expressed by $(2-x-y)BaO.x(Sr, Ca)O.(1-a-b-c-d)SiO_2.aP_2O_2\ bAl_2O_3\ cBsO_3\ dGeO_2$:y $Eu^{2+}$ (where: $0.01 < x < 1.6$; $0.005 < y < 0.5$; and $0 < a, b, c, d < 0.5$); and oxynitride phosphors structurally containing nitrogen, such as oxynitride glass, β-sialon, and α-sialon, which are structurally stable substances capable of shifting the excited light and the emitted light to greater wavelengths.

Figure 14:
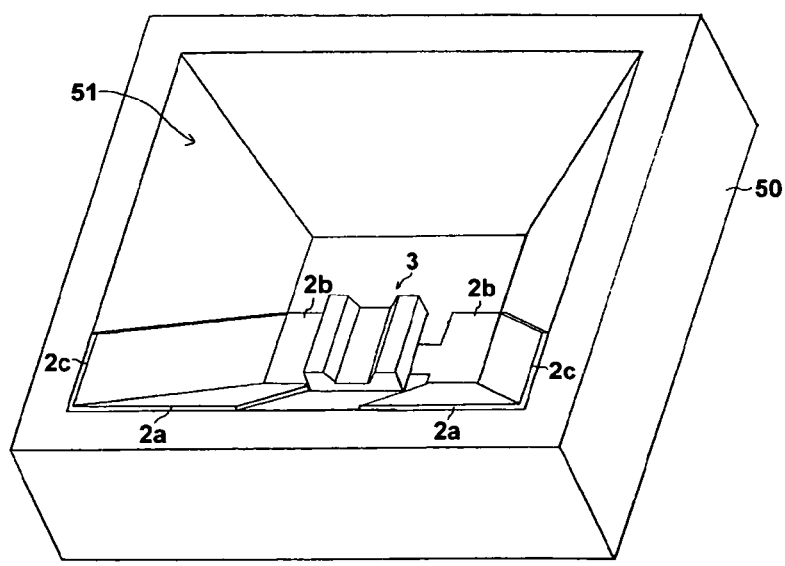
FIG. 14 is a schematic perspective view for explaining steps for manufacturing an optical device (photoreceptor)

A third practical example of the optical device 1 is a diagonal photoreceptor (PD). This third practical example is the same as the first practical example in that the metal film 2 in the configuration shown in FIGS. 3A and 3B is made of a Ni-plated copper base, followed by Au plating. A PD chip 3 of the back-illuminated type is bonded (die bonded) to the second plane 2b of this metal film 2 with gold bumps as shown in FIG. 14, and the resultant structure is protected by the sealing resin 4. The first plane 2a of the metal film 2 is matched with the mounting board 10 as shown in FIG. 4, whereby a PD photoreceptor for receiving light in a diagonal direction is provided.

Figure 15:
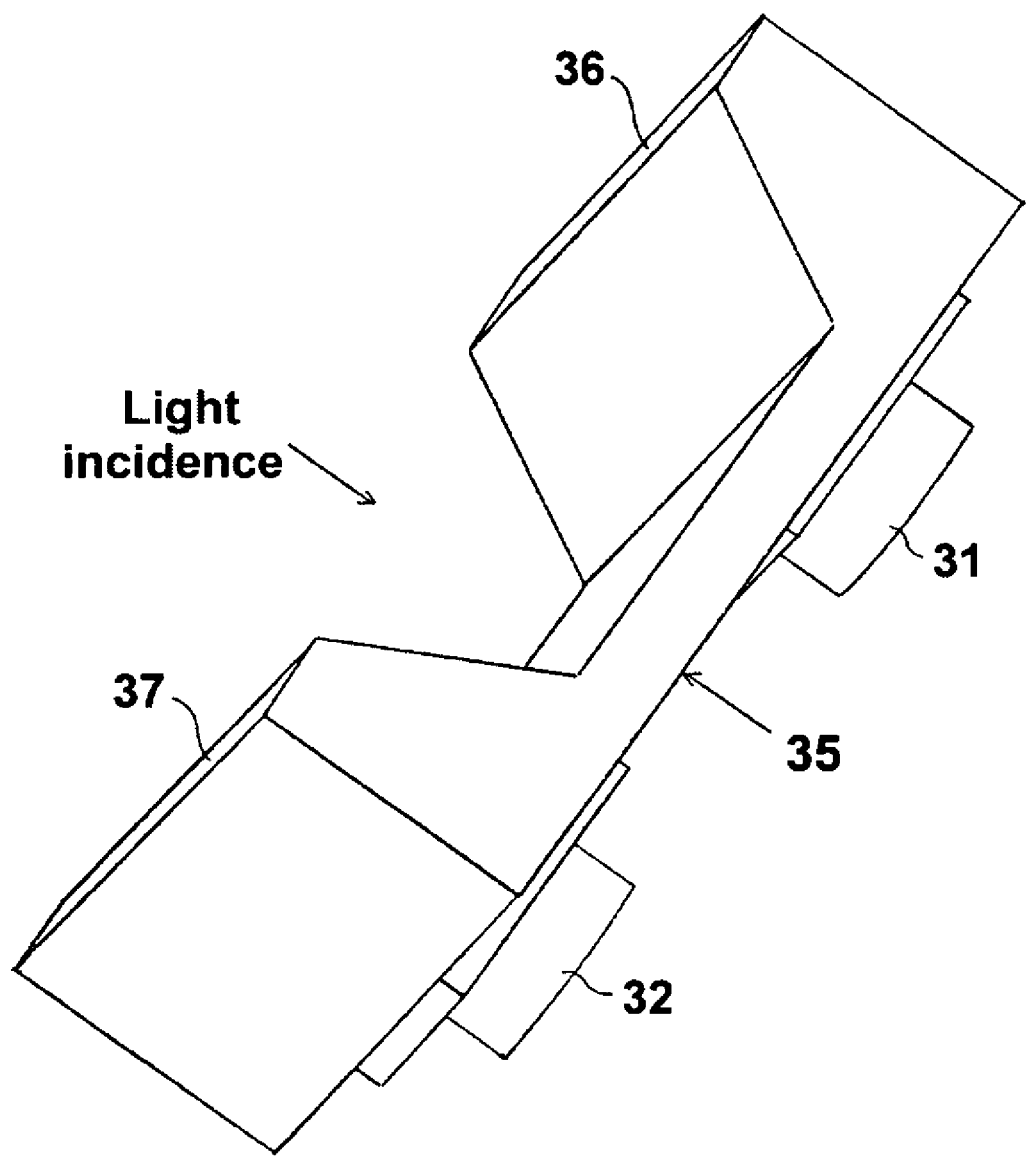
FIG. 15 is a schematic perspective view showing an example of the configuration of a PD chip.

FIG. 15 is a schematic perspective view showing an example of the configuration of the back-illuminated PD chip 3 to be die bonded to the second plane 2b of the metal film 2 as shown in FIG. 14. In the example of FIG. 15, the back-illuminated PD chip 3 is configured as a flip-chip PD, on one side of which a first bump 31 for functioning as a positive electrode and a second bump 32 for functioning as a negative electrode are formed. In this instance, the PD chip 3 can be die bonded to the metal film 2 (predetermined electrode patterns of the metal film) by bonding the first bump 31 to a positive electrode pattern of the metal film 2 and the second bump 32 to a negative electrode pattern of the metal film 2. Note that in the back-illuminated PD chip 3 shown in FIG. 15, the pn junction 35 intended for photoelectric conversion is located on a side opposite from the light incident side. In order to make it easier for the light incident on the PD chip 3 to reach the pn junction 35, the light incident side of the PD chip 3 is etched off to near the pn junction 35, except for the ends 36 and 37 (the ends 36 and 37 are necessary for maintaining the structural strength of the PD chip 3). The resultant structure is protected by the sealing material (sealing resin) 4 such as epoxy resin, thereby completing a diagonal photoreceptor.

Among examples of the PD which can be used in the optical device 1 are an avalanche photodetector (APD) and a phototransistor.

The diagonal photoreceptor according to the foregoing third practical example of the optical device 1 can receive light diagonally when it is mounted on the mounting board 10 like other surface-mount devices. This eliminates the need for a forming process with respect to diagonal incidence of light. Moreover, a large number of products can be manufactured easily by batch etching, followed by a eutectic reflow process.

The present invention can be applied to light sources for backlights, car-mount indicators, light sources for flash lamps, light sources for indirect illumination, emergency lamps, light sources for temperature sensors, light sources for gas sensors, light sources for floricultural growth control, fishing light sources, light sources for astral lamps, light sources for optical CT, light sources for destroying leukemia cells, traplight sources, light sources for photocatalytic excitation, photoreceptors for human detection sensors, photoreceptors for paper detection sensors, and the like.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. All related art references described above are hereby incorporated in their entirety by reference.

What is claimed is:

1. An optical device comprising:
    a metal film including a first plane and a second plane electrically connected to the first plane, the second plane being arranged at an obtuse angle $\theta$, where $90°<\theta<180°$, with respect to the first plane, wherein the second plane of the metal film includes a positive electrode pattern and a negative electrode pattern, and the first plane of the metal film includes a positive electrode pattern and a negative electrode pattern continuous with the positive electrode pattern and negative electrode pattern of the second plane;
    an optical semiconductor chip having a positive electrode and a negative electrode on a same surface thereof and an optical axis, wherein the optical semiconductor chip is flip-chip mounted on the positive electrode pattern and the negative electrode pattern of the metal film only on the second plane; and
    a light-transmitting sealing material for sealing the optical semiconductor chip, the light-transmitting sealing material having the metal film provided on a surface thereof, and the light transmitting sealing material conforming to the first plane and the second plane of the metal film,
    wherein the first plane is mounted on a surface of a mounting board, so that the optical axis of the optical semiconductor chip is inclined with respect to the surface of the mounting board.

2. The optical device according to claim 1, wherein the metal film includes side portions on both sides of the first plane and the second plane, the side portions being electrically connected to the first plane and the second plane.

3. The optical device according to claim 2, wherein each of the side portions has a notch.

4. The optical device according to claim 1, wherein the sealing material has a lens shape such that the sealing material functions as a lens with respect to the optical semiconductor chip.

5. The optical device according to claim 2, wherein the sealing material has a lens shape such that the sealing material functions as a lens with respect to the optical semiconductor chip.

6. The optical device according to claim 3, wherein the sealing material has a lens shape for functioning as a lens with respect to the optical semiconductor chip.

7. The optical device according to claim 1, wherein the optical semiconductor chip comprises a light emitting element, and the optical device functions as a projector.

8. The optical device according to claim 2, wherein the optical semiconductor chip comprises a light emitting element, and the optical device functions as a projector.

9. The optical device according to claim 3, wherein the optical semiconductor chip comprises a light emitting element, and the optical device functions as a projector.

10. The optical device according to claim 4, wherein the optical semiconductor chip comprises a light emitting element, and the optical device functions as a projector.

11. The optical device according to claim 7, wherein the sealing material contains a wavelength converting material.

12. The optical device according to claim 8, wherein the sealing material contains a wavelength converting material.

13. The optical device according to claim 9, wherein the sealing material contains a wavelength converting material.

14. The optical device according to claim 10, wherein the sealing material contains a wavelength converting material.

15. The optical device according to claim 1, wherein the optical semiconductor chip comprises a light receiving element, and the optical device functions as a photoreceptor.

16. The optical device according to claim 2, wherein the optical semiconductor chip comprises a light receiving element, and the optical device functions as a photoreceptor.

17. The optical device according to claim 3, wherein the optical semiconductor chip comprises a light receiving element, and the optical device functions as a photoreceptor.

18. The optical device according to claim 4, wherein the optical semiconductor chip comprises a light receiving element, and the optical device functions as a photoreceptor.

19. The optical device according to claim 1, wherein the light-transmitting sealing material has a parallelogram cross-section formed by the first plane, the second plane, a third plane parallel to the first plane farther from the metal layer of the second plane, and a fourth plane parallel to the second plane adjacent to the first plane, the parallelogram cross-section being taken along a plane perpendicular both to the first plane and the second plane.

20. The optical device according to claim 2, wherein the side portions have a polygonal shape formed on respective side planes of the light-transmitting sealing material, and wherein one of the side portions is continuous with the positive electrode pattern and negative electrode pattern of one of the first and second planes of the metal film, and the other of the side portions is continuous with the positive electrode pattern and negative electrode pattern of the other of the first and second planes of the metal film.

* * * * *